(12) United States Patent
Li et al.

(10) Patent No.: US 7,688,130 B2
(45) Date of Patent: Mar. 30, 2010

(54) PASSIVE MIXER HAVING TRANSCONDUCTANCE AMPLIFIER WITH SOURCE DEGENERATION CAPACITANCE

(75) Inventors: Shaorui Li, Summit, NJ (US); Jinghong Chen, Basking Ridge, NJ (US); Lawrence Rigge, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/865,368

(22) Filed: Oct. 1, 2007

(65) Prior Publication Data

US 2009/0085642 A1  Apr. 2, 2009

(51) Int. Cl.
*G06F 7/44* (2006.01)
(52) U.S. Cl. .................. 327/359; 327/355; 327/356
(58) Field of Classification Search .............. 327/65, 327/355, 356, 359, 563; 330/253, 254; 455/326
See application file for complete search history.

(56) References Cited

U.S. PATENT DOCUMENTS 6,819,166 B1 * 11/2004 Choi et al. ................. 327/551
7,016,664 B2 * 3/2006 Souetinov .................. 455/323
2004/0141552 A1 * 7/2004 Yang et al. ................. 375/229
2006/0001504 A1 * 1/2006 Singh et al. ............... 333/28 R

OTHER PUBLICATIONS

Behzad Razavi, "Design of Integrated Circuits for Optical Communications,", The McGraw-Hill Companies, 2002 www.books.google.com [retrieved on Jul. 13, 2009] Retrieved from the Internet: http://books.google.com/books?id=vysQEjz0UicC, pp. 133-136.

* cited by examiner

*Primary Examiner*—Long Nguyen
(74) *Attorney, Agent, or Firm*—Mendelsohn, Drucker, & Associates, P.C.; Edward J. Meisarosh; Steve Mendelsohn

(57) ABSTRACT

A passive mixer includes a transconductance amplifier having a source degeneration capacitance. The transconductance amplifier has an input for receiving an input signal and an output for outputting a current signal. A multiplier is provided for mixing a local oscillator signal with the current signal so as to provide an output signal at an output of the passive mixer. A capacitive load is connected to the output of the passive mixer.

20 Claims, 7 Drawing Sheets

PASSIVE MIXER HAVING TRANSCONDUCTANCE AMPLIFIER WITH SOURCE DEGENERATION CAPACITANCE

FIELD OF THE INVENTION

The present invention relates to circuits generally, and more specifically to passive mixers.

BACKGROUND

Capacitor banks tuned by calibration circuitry can be applied for process-voltage-temperature (PVT) compensation in passive mixers. FIG. 1 shows the circuit of a double-balanced current-mode passive mixer 100, loaded with tunable capacitor banks $C_1, C_2, \ldots, C_N$. First, the input voltage $V_{in}$ is converted to current $I_{in}$ by a transconductance amplifier $G_m$. Then the current $I_{in}$ is fed into the switches controlled by complimentary local oscillator (LO) signals, and is accumulated on the load capacitor banks $C_1, C_2, \ldots, C_N$.

The local oscillator (LO) generates complimentary signals which are beat against the signal of interest to mix it to a different frequency. The local oscillator (LO) signals control the switches in mixer 100, while the signal of interest is injected at the input of the mixer 100, to produce the sum and difference of their frequencies. These are the beat frequencies. Normally for a down converter, the beat frequency is the difference between the two; while for an up converter, the beat frequency is the sum of the two.

The current accumulated on the capacitor banks $C_1, C_2, \ldots, C_N$ provides the output voltage $V_{out}$. The capacitor banks $C_1, C_2, \ldots, C_N$ are controlled by a calibration circuit 102, providing a total capacitance of:

$$C_{total} = \sum_{k=0}^{N} h_k C_k \quad (1)$$

where $h_k=0$ or 1, representing the digital control bits; and $C_k=C_1, C_2, \ldots, C_N$.

The conversion gain CG of the mixer can be derived as:

$$CG = \frac{v_{out}}{v_{in}} = \frac{2}{\pi} \cdot \frac{G_m}{2\pi f_{out} C_{total}} \quad (2)$$

where $f_{out}$ is the output frequency; and $G_m$ is the transconductance of a transconductance amplifier, commonly implemented by active devices, as shown in FIG. 2. $I_B$ is the DC biasing current. The transconductance $G_m$ is given by:

$$G_m = \frac{i_o}{v_{in}} = \frac{g_m}{2} \quad (3)$$

where $g_m$ is the small-signal transconductance of the transistors M1 and M2. A transconductance amplifier ($g_m$ amplifier) puts out a current proportional to its input voltage. In network analysis the transconductance amplifier is defined as a voltage controlled current source (VCCS). In field effect transistors, transconductance is the change in the drain/source current divided by the change in the gate/drain voltage with a constant drain/source voltage. Typical values of $g_m$ for a small-signal field effect transistor are also 1 to 10 millisiemens.

Substituting (3) into (2), provides the mixer conversion gain as:

$$CG = \frac{v_{out}}{v_{in}} = \frac{1}{\pi} \cdot \frac{g_m}{2\pi f_{out} C_{total}} \quad (4)$$

In sub-micron processes, the small-signal transconductance $g_m$ can vary in magnitude by 2-3 times due to PVT variation. Thus, to compensate for the PVT-induced gain variation, the load capacitance $C_{total}$ covers a wide range, resulting in a large silicon area, especially when a low density capacitor (such as a metal capacitor) is used (for example, to achieve good linearity of the mixer).

Further, the calibration circuit 102 was needed to detect the mixer gain variation, and then to tune the capacitor banks, resulting in significant power consumption.

The PVT compensation circuitry and calibration circuitry 102 consume high power and a large silicon area, especially when the PVT-induced gain variation is large, as in the case of current-mode passive mixers 100.

SUMMARY OF THE INVENTION

In some embodiments, a passive mixer comprises a transconductance amplifier having a source degeneration capacitance. The transconductance amplifier has an input for receiving an input voltage signal and an output for outputting a current signal. A multiplier is provided for mixing a local oscillator signal with the current signal so as to provide an output signal at an output of the passive mixer. A capacitive load is connected to the output of the passive mixer.

In some embodiments, a method comprises receiving an input voltage signal with a transconductance amplifier having a source degeneration capacitance. A current signal is output from the transconductance amplifier. A local oscillator signal is mixed with the current signal to generate an output signal. The output signal is provided at an output of the passive mixer. The output has a capacitive load connected thereto.

DETAILED DESCRIPTION

This description of the exemplary embodiments is intended to be read in connection with the accompanying drawings, which are to be considered part of the entire written description.

A current-mode passive mixer 300, 800, 900 with conversion gain that is independent of process, voltage, and temperature (PVT) variation is described below, with reference to FIGS. 3-9. Optionally, the conversion gain may be programmable. Using this technique, the conversion gain of the current-mode passive mixer 300, 800, 900 is proportional to the ratio of the source degeneration capacitance $C_S$ to the load capacitance $C_L$. Thus, although the absolute capacitance and other circuit parameters vary with PVT, the ratio of the source degeneration capacitance $C_S$ to the load capacitance $C_L$ is independent of PVT variation, and so is the mixer conversion gain. In particular, if $C_S$ and $C_L$ are of the same type of construction, then both are assured to vary in the same manner together in response to any PVT variation, so that the ratio thereof stays constant, independent of the PVT variation.

Figure 1:
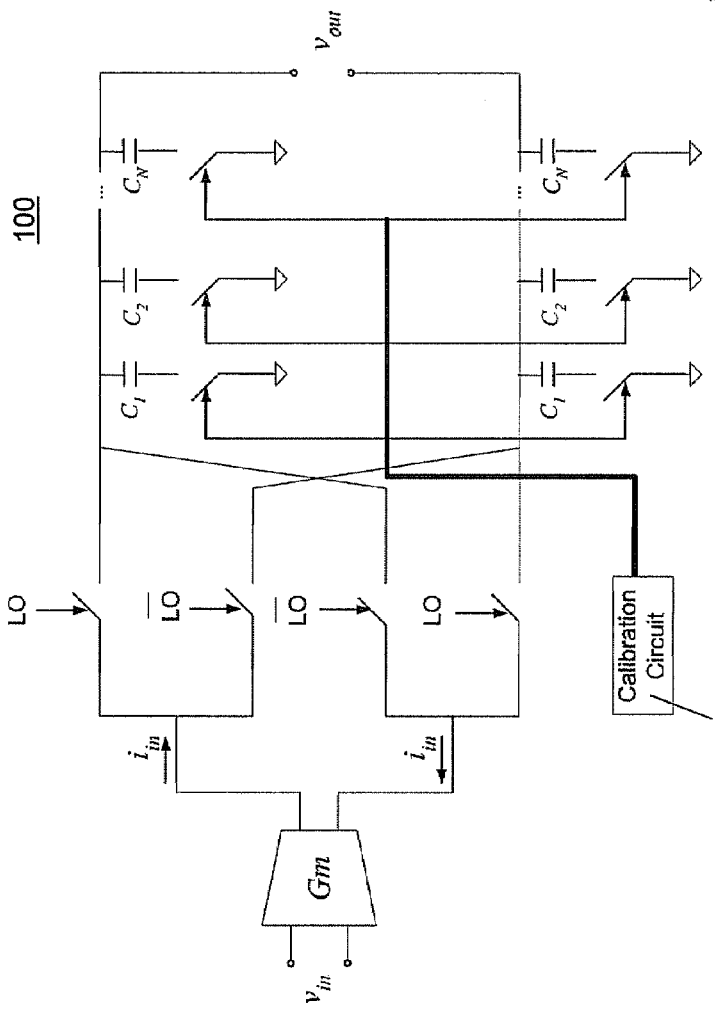
FIG. 1 is a schematic diagram of a conventional passive mixer having calibration circuitry and tunable capacitor banks.

This technique eliminates the need for extra PVT compensation circuitry, such as the wide-range capacitor banks (e.g., $C_1, C_2, \ldots, C_N$ shown in FIG. 1) tuned by calibration circuitry (e.g., circuit 102 in FIG. 1). Moreover, the conversion gain of the exemplary mixer 300 can optionally be made programmable, by switching between different load capacitance $C_L$ (or switching between different source-degeneration capacitance $C_S$), without relying on any gain detecting circuitry.

Using the exemplary technique, the conversion gain of the current-mode passive mixer is proportional to the ratio of the source degeneration capacitance $C_S$ to the load capacitance $C_L$, which is independent of PVT variation and is (optionally) programmable without relying on any gain detecting circuitry.

Figure 3:
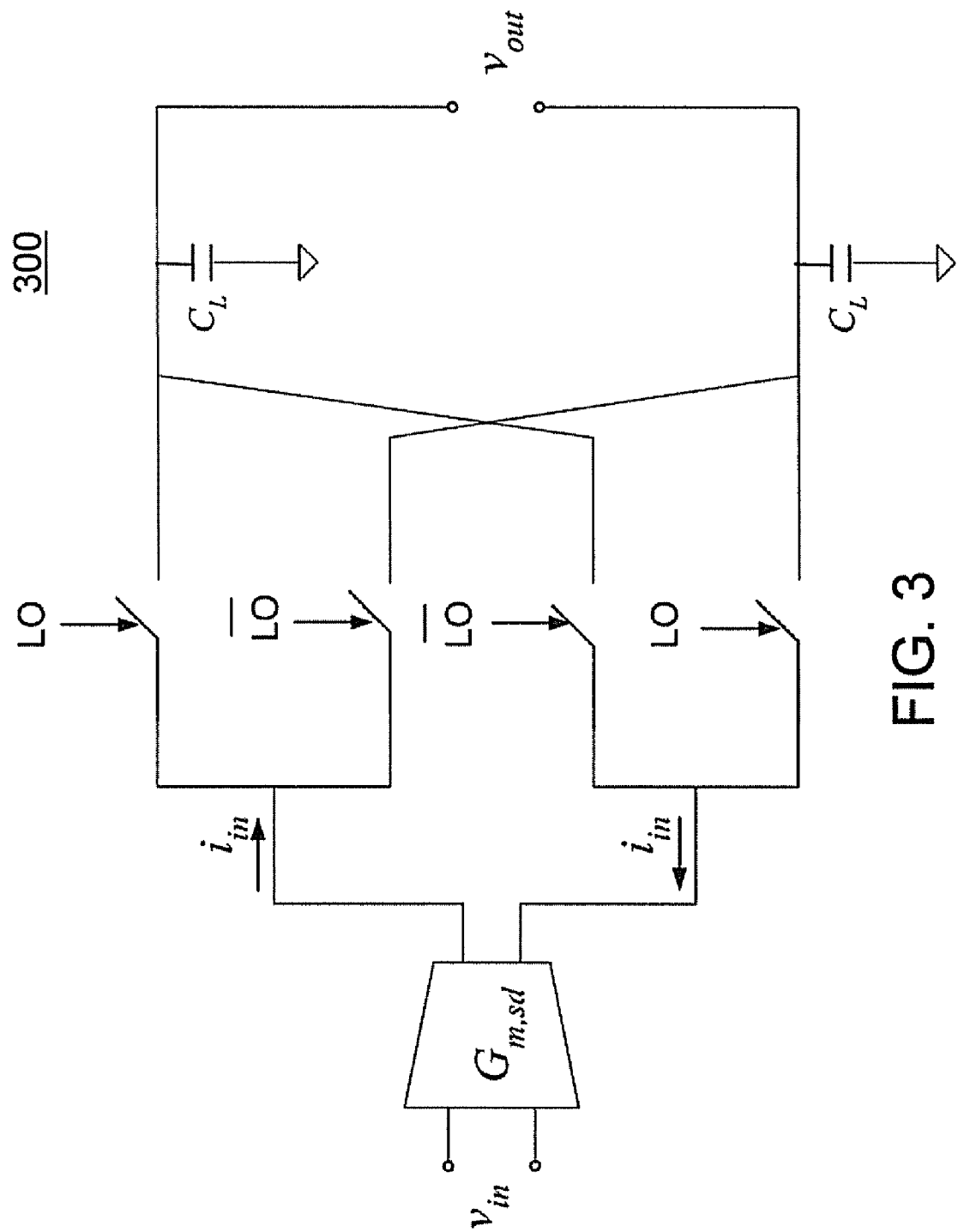
FIG. 3 is a schematic diagram of a passive mixer according to an exemplary embodiment.

FIG. 3 shows a passive mixer 300, including a transconductance amplifier $G_{m,sd}$ with a source degeneration capacitance $C_S$. In the example of FIG. 3, the capacitive load $C_L$ does not require a bank of switchable capacitors to compensate for PVT variation, so there is no need for a calibration circuit to control switching of capacitors within capacitor banks. The mixer 300 may be a down-converting mixer, in which case the input voltage $V_{in}$ is a high or radio frequency signal, and the output voltage, $V_{out}$ is a low or intermediate frequency signal. Alternatively, the mixer 300 may be an up-converting mixer, in which case the input voltage $V_{in}$ is a low or intermediate frequency signal, and the output voltage, $V_{out}$ is a high or radio frequency signal.

First, the input voltage $V_{in}$ is converted to current $I_{in}$ by a transconductance amplifier $G_{m,sd}$. Then the current $I_{in}$ is fed into the switches controlled by complimentary local oscillator (LO) signals, and is accumulated on the load capacitance $C_L$.

The local oscillator (LO) generates complimentary signals which are beat against the input signal $V_{in}$ to mix it to a different frequency. The local oscillator (LO) signals control the switches in mixer 300, while the signal $V_{in}$ is injected at the input of the mixer 300, to produce the sum and difference of their frequencies, one of which (depending on the goal of mixing, either up-conversion or down-conversion,) will be the output frequency of interest.

Figure 4B:
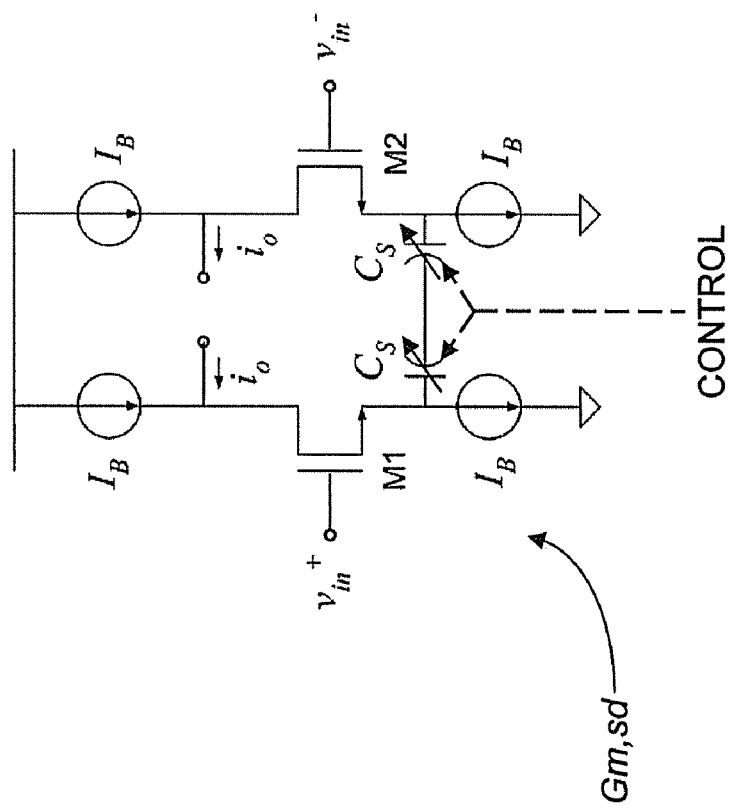
FIG. 4B is a schematic diagram of a transconductance amplifier suitable for use in the mixer of FIG. 3, including an adjustable capacitor.
Figure 4A:
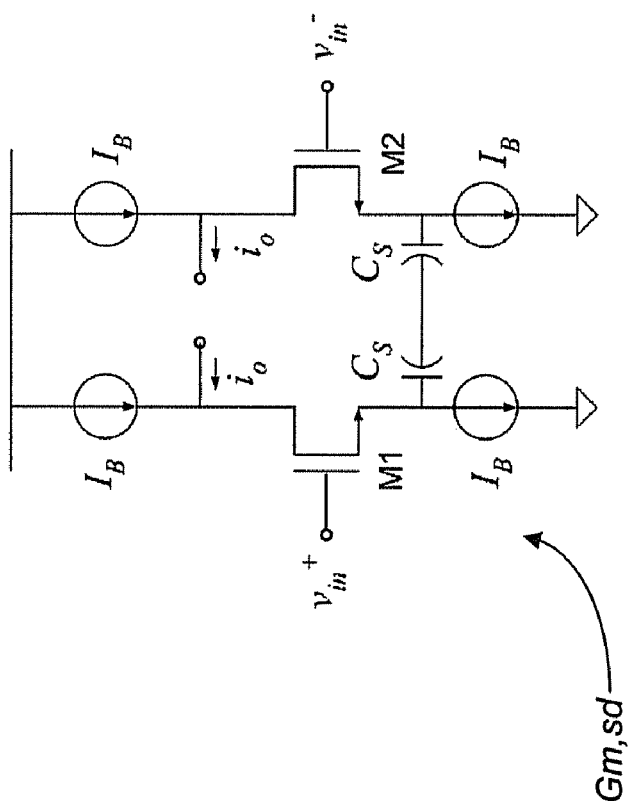
FIG. 4A is a schematic diagram of a transconductance amplifier suitable for use in the mixer of FIG. 3.

FIG. 4A is a schematic diagram of the transconductance amplifier $G_{m,sd}$ shown in FIG. 3. FIG. 4A introduces a capacitive source degeneration structure Cs to the transconductance amplifier $G_{m,sd}$, shown in FIG. 3. The transconductance is given by:

$$G_{m,sd} = \frac{i_o}{v_{in}} = \frac{1}{2} \cdot \frac{g_m}{1 + \frac{g_m}{2\pi f_{in} C_S}} \approx \pi f_{in} C_S, \quad (5)$$

$$\text{when } \frac{g_m}{2\pi f_{in} C_S} \gg 1$$

where $f_{in}$ is the frequency of the input signal $V_{in}$.

With this transconductance amplifier $G_{m,sd}$, a current-mode passive mixer 300 loaded with a single load capacitance $C_L$ is implemented, as shown in FIG. 3. The conversion gain of the mixer 300 is provided by the equation:

$$\begin{aligned} CG_{sd} &= \frac{v_{out}}{v_{in}} = \frac{2}{\pi} \cdot \frac{G_{m,sd}}{2\pi f_{out} C_L} \\ &= \frac{2}{\pi} \cdot \frac{\pi f_{in} C_S}{2\pi f_{out} C_L} \\ &= \frac{1}{\pi} \cdot \frac{f_{in} C_S}{f_{out} C_L} \end{aligned} \quad (6)$$

In equation (6), the frequencies $f_{in}$, and $f_{out}$ are generally pre-defined in a given system. Thus the conversion gain of the mixer is proportional to the ratio of the source degeneration capacitance $C_S$ and the load capacitance $C_L$. If Capacitors $C_S$ and $C_L$ are the same type of capacitors, the ratio of the capacitance $C_S/C_L$ is independent of PVT variation, and so is the mixer conversion gain $CG_{sd}$. Thus, extra PVT compensation with capacitor banks tuned by extra calibration circuitry is not necessary, saving both power and silicon area.

In some embodiments, if the conversion gain $CG_{sd}$ of the mixer 300 is desired to be programmable, the capacitive load $C_L$ may be provided by variable capacitors, or the source degeneration capacitors $C_S$ may be variable capacitors. Choosing different values of the load capacitor $C_L$ (or choosing different values of the source degeneration capacitor $C_S$), the conversion gain is precisely determined by the ratio $C_S/C_L$. Gain detection circuitry is not necessary.

FIG. 4B shows a variation of the transconductance amplifier of FIG. 4A, in which the source degeneration capacitance is optionally provided by a controlled capacitor in either the analog fashion or the digital fashion. The remaining elements of FIG. 4B are the same as in the transconductance amplifier of FIG. 4A.

Figure 2:
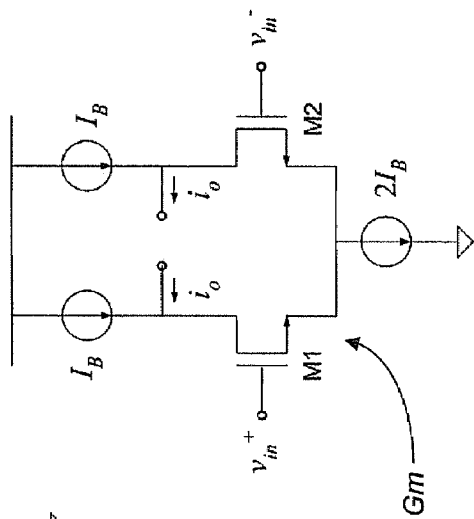
FIG. 2 is a schematic diagram of a transconductance amplifier suitable for use in the mixer of FIG. 1.
Figure 6:
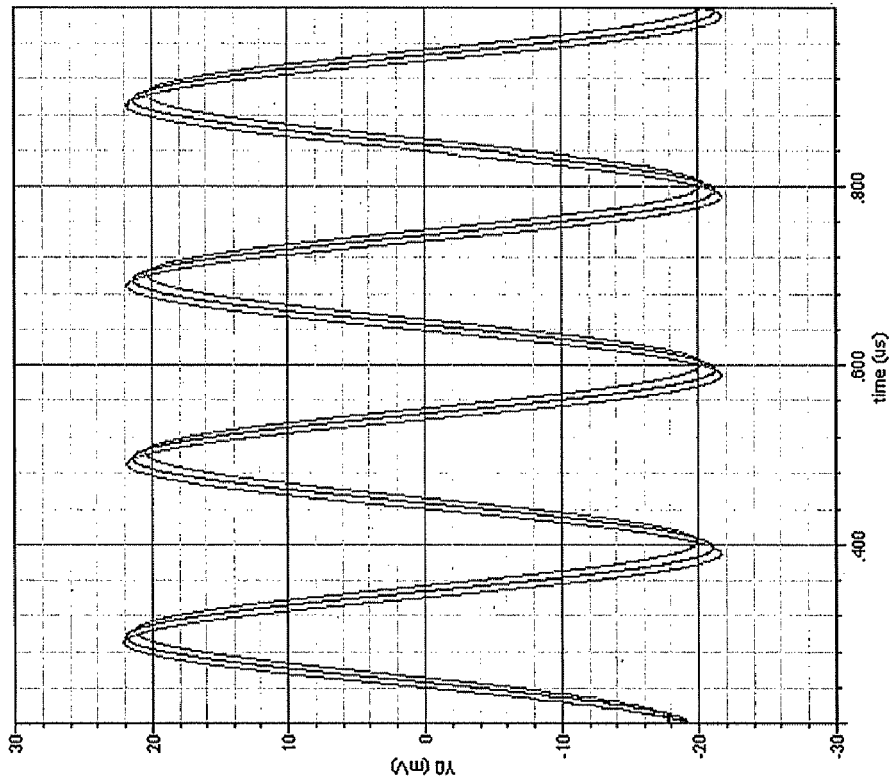
FIG. 6 is a graph showing simulated variation in output of the mixer of FIG. 3 at the three PVT corners used in FIG. 5.
Figure 5:
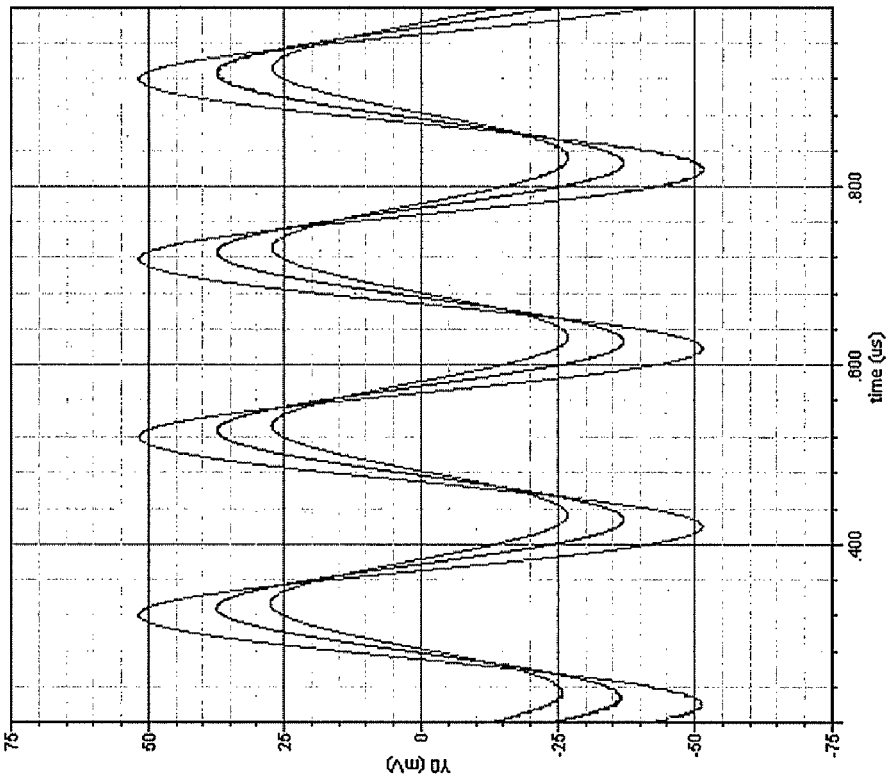
FIG. 5 is a graph showing simulated variation in output of the conventional mixer of FIG. 1 at three different PVT corners.

FIGS. 5 and 6 show simulation results comparing the output voltages of the conventional structure (shown in FIG. 1 and FIG. 2) and the exemplary structure (shown in FIG. 3 and FIG. 4), applying the same input signal. Both structures are down-converting the input high-frequency signal to an output low-frequency signal. The output frequency is the difference of the input frequency and the local oscillator (LO) frequency. Different PVT corners were applied, which induced variation of $g_m$, $C_{total}$ (without any tuning), $C_L$, and $C_S$. As shown in FIG. 5, the output of the conventional structure of FIGS. 1 and 2 varies around 6 dB from the slowest PVT corner to the fastest PVT corner. FIG. 6 shows that the output of the exemplary structure of FIGS. 3 and 4 varies only 0.6 dB from the slowest PVT corner to the fastest PVT corner.

Figure 7:
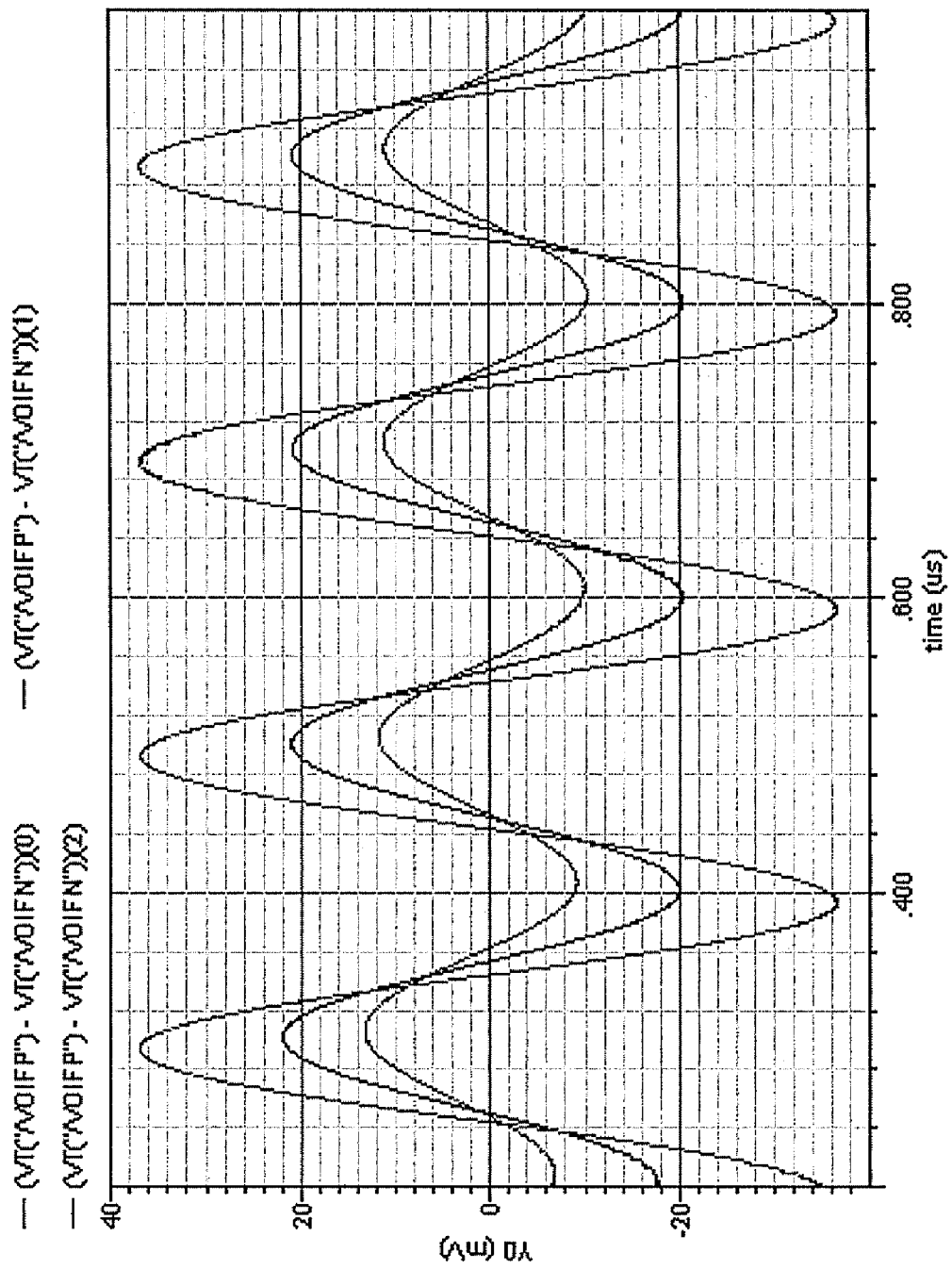
FIG. 7 is a graph showing simulated output of the mixer of FIG. 3 as a function of load capacitance.

FIG. 7 shows the programmability of the exemplary structure according to simulation results. By switching between different values of $C_L$ (10 pF, 20 pF, and 40 pF), the conversion gain of the mixer varies accordingly. The peak amplitudes in FIG. 7 are as predicted by equation (6). As noted above, the programming may be adjustable, through use of an adjustable capacitor $C_S$ or $C_L$ or the programming may be implemented by selecting a fixed source degeneration value from among various capacitance values.

Using the exemplary technique, the conversion gain $CG_{sd}$ of the current-mode passive mixer 300 is proportional to the ratio of the source degeneration capacitance $C_S$ to the load capacitor $C_L$. Thus, the conversion gain $CG_{sd}$ is programmable and is independent of PVT variation. Compared to the use of capacitor banks $C_1, C_2, \ldots, C_N$ tuned by extra calibration circuitry 102 for PVT compensation, the exemplary technique consumes less power and less silicon area, and provides programmability without relying on any gain detecting circuitry.

As noted above, the mixer 300 may be a down-converting or up-converting mixer, with the conversion gain of $1/\pi * (f_{in} * C_S)/(f_{out} * C_L)$. For a down-converting mixer, since the input frequency $f_{in}$ is higher than the output frequency $f_{out}$, it is not difficult to achieve usable gain. For a up-converting mixer where the input frequency $f_{in}$ is lower than the output frequency $f_{out}$, to achieve usable gain of the mixer, it is preferred to use the up-converting mixer with high input frequency (such as in a high-IF architectures), or in embodiments in which Cs or $C_L$ (or both of them) are implemented off-chip.

In FIGS. 3, 4A, and 4B, double-balanced and differential configurations are used. Although FIG. 3 shows a double-balanced structure, the invention is not limited thereto.

Figure 8:
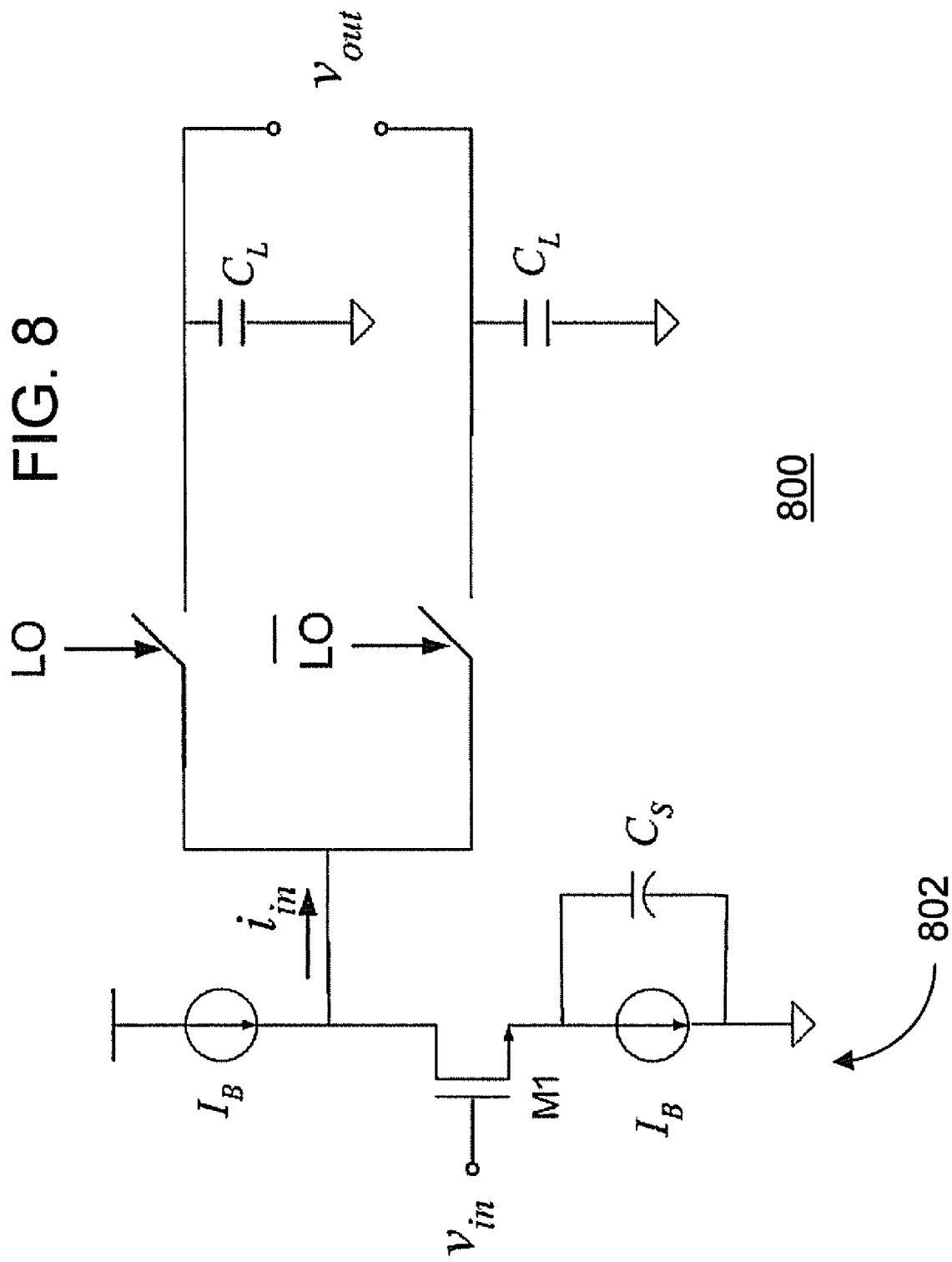
FIG. 8 is a schematic diagram of a single-balanced passive mixer according to an exemplary embodiment.

FIG. 8 shows a single-balanced mixer structure 800, including a single-ended transconductance amplifier 802 with a source degeneration capacitance Cs. Like elements in FIGS. 3, 4, and 8 are shown by like reference numerals.

Although in FIGS. 3 and 8, a single capacitor is drawn to represent the capacitive load $C_L$, the invention is not limited thereto. Rather, a capacitive load can be any simple or complicated structure which loads the mixer capacitively.

Figure 9:
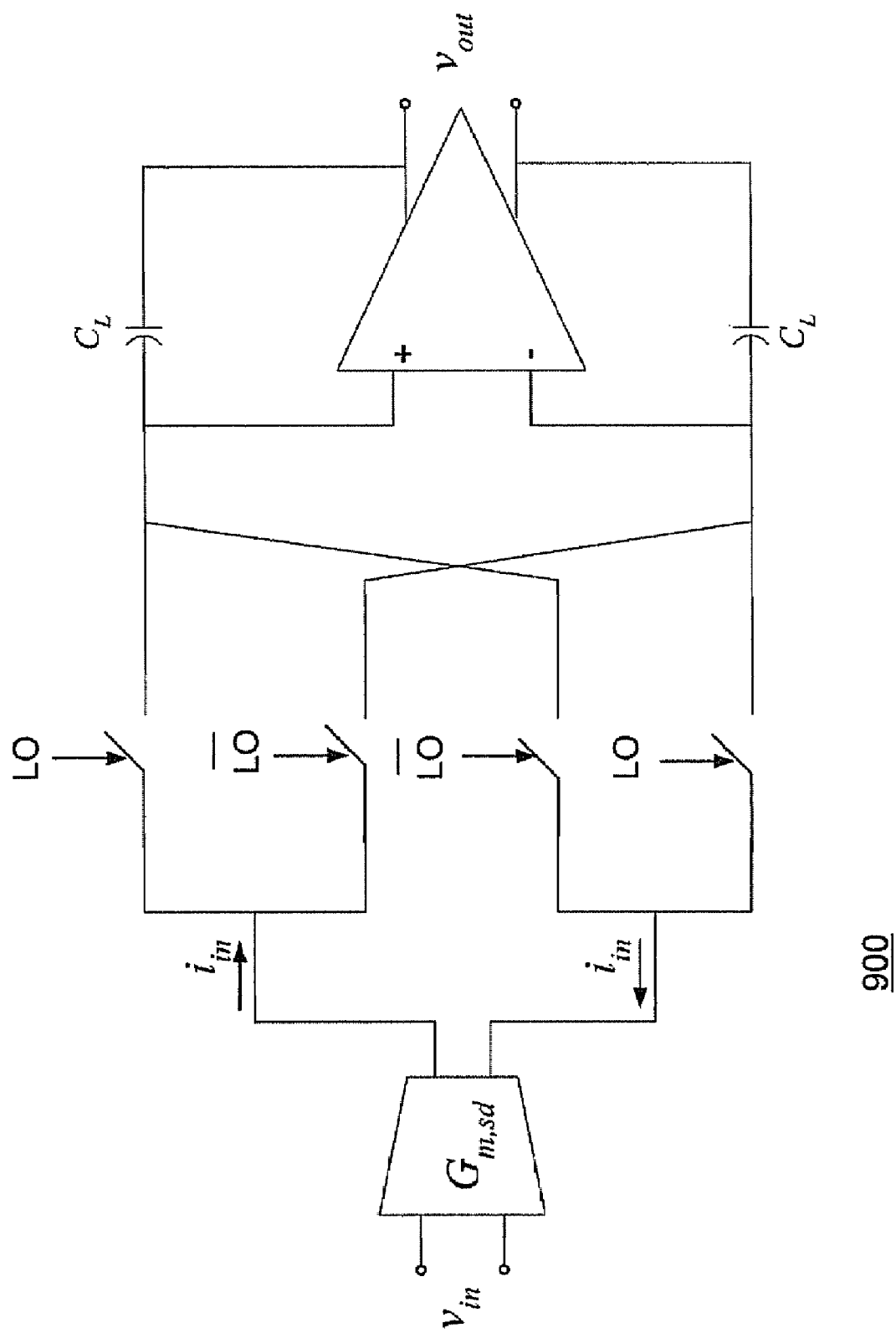
FIG. 9 is a schematic diagram of an exemplary mixer including an operational amplifier with a feedback capacitor as the capacitive load.

FIG. 9 shows a double-balanced mixer structure 900, loaded with an operational-amplifier (OPAMP) with a capacitor in the feedback path. Like elements in FIGS. 3, 8, and 9 are shown by like reference numerals.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A passive mixer, comprising:
   a transconductance amplifier having a source degeneration capacitance, the transconductance amplifier having an input for receiving an input signal and an output for outputting a current signal;
   a multiplier for mixing a local oscillator signal with the current signal so as to provide an output signal at an output of the passive mixer; and
   a capacitive load connected to the output of the passive mixer.

2. The passive mixer of claim 1, wherein the transconductance amplifier includes:
   two transistors, each transistor having a source, and
   a single capacitive structure connected between the respective sources of each of the two transistors.

3. The passive mixer of claim 2, wherein the single capacitive structure includes two capacitors connected in series, and a small signal transconductance $g_m$ of the two transistors satisfies the following inequality:

$$\frac{g_m}{2\pi f_{in} C_S} \gg 1,$$

where:
   $f_{in}$ is a frequency of the input signal, and
   $C_s$ is the capacitance of each of the two capacitors connected in series.

4. The passive mixer of claim 1, wherein the transconductance amplifier includes:
   a transistor having a source, and
   a single capacitive structure connected between the source of the transistor and ground.

5. The passive mixer of claim 4, wherein a small signal transconductance $g_m$ of the single capacitive structure satisfies the following inequality:

$$\frac{g_m}{2\pi f_{in} C_S} \gg 1,$$

where:
   $f_{in}$ is a frequency of the input signal, and
   $C_s$ is the capacitance of the single capacitive structure.

6. The passive mixer of claim 1, wherein the passive mixer has a conversion gain that is proportional to a ratio of the source degeneration capacitance in the transconductance amplifier to the load capacitance of the capacitive load.

7. The passive mixer of claim 6, wherein the conversion gain is substantially constant, independent of a fabrication process variation during fabrication of the passive mixer or a variation in an operating voltage or operating temperature of the passive mixer during operation thereof.

8. The passive mixer of claim 6, wherein the transconductance amplifier comprises variable source degeneration capacitance.

9. The passive mixer of claim 8, wherein the variable capacitance is operable by a control signal thereof, for programming a conversion gain of the passive mixer.

10. The passive mixer of claim 1, wherein a first capacitor that provides the source degeneration capacitance and a second capacitor that provides the capacitive load are of the same capacitor type as each other.

11. The passive mixer of claim 1, wherein the mixer is loaded with an operational-amplifier having a feedback path coupled to the output of the passive mixer, with the capacitive load included in the feedback path.

12. The passive mixer of claim 3, wherein the two capacitors are non-variable capacitors.

13. The passive mixer of claim 1, wherein the capacitive load is the only internal load connected to the output of the passive mixer.

14. A method of operation of a passive mixer, said method comprising the steps of:
   receiving an input signal with a transconductance amplifier having a source degeneration capacitance,
   outputting a current signal from the transconductance amplifier;
   mixing a local oscillator signal with the current signal to generate an output signal, and
   outputting the output signal at an output of the passive mixer, the output having a capacitive load connected thereto.

15. The method of claim 14, further comprising adjusting a conversion gain of the passive mixer by adjusting a ratio of the source degradation capacitance to the capacitive load, independently of a fabrication process variation during fabrication of the passive mixer or a voltage or temperature variation of the passive mixer during operation thereof.

16. The method of claim 15, wherein the adjusting step comprises adjusting the source degradation capacitance.

17. The method of claim 15, wherein the adjusting step comprises adjusting the capacitive load.

18. The method of claim 14, further comprising controlling a conversion gain of the passive mixer by setting a ratio of the source degradation capacitance to the capacitive load, independently of a conversion gain of the passive mixer.

19. The method of claim 14, further comprising controlling a conversion gain of the passive mixer by setting a ratio of the source degradation capacitance to the capacitive load, without relying on a gain detection.

20. The method of claim 14, further comprising controlling a conversion gain of the passive mixer by setting a ratio of the source degradation capacitance to the capacitive load, without requiring a tuning step.

* * * * *